United States Patent [19]

Holland

[11] 4,456,800

[45] Jun. 26, 1984

[54] PLANAR CONTACT ARRAY SWITCH HAVING IMPROVED GROUND PATH FOR DISSIPATING ELECTROSTATIC DISCHARGES

[75] Inventor: John P. Holland, Milwaukee, Wis.

[73] Assignee: Allen-Bradley Company, Milwaukee, Wis.

[21] Appl. No.: 498,046

[22] Filed: May 25, 1983

[51] Int. Cl.³ .................... H01H 9/02; H01H 13/04; H05F 3/02

[52] U.S. Cl. .................... 200/5 A; 174/68.5; 200/159 B; 200/305; 361/212; 361/220

[58] Field of Search ............ 200/5 A, 292, 304, 305, 200/159 B; 174/68.5; 361/397, 212, 220

[56] References Cited

U.S. PATENT DOCUMENTS

| | | | |
|---|---|---|---|
| 3,668,417 | 6/1972 | Sessler et al. | 200/305 |
| 3,769,869 | 11/1973 | Nelson, Jr. | 200/305 X |
| 3,787,732 | 6/1974 | Larson | 307/116 |
| 3,887,848 | 6/1975 | Larson et al. | 361/56 |
| 3,911,233 | 10/1975 | Nakamura | 200/5 R |
| 3,987,259 | 10/1976 | Larson | 200/5 A |
| 3,988,551 | 10/1976 | Larson | 200/159 B X |
| 3,995,126 | 11/1976 | Larson | 200/159 B X |
| 4,028,509 | 6/1977 | Zurcher | 200/5 A |
| 4,040,120 | 8/1977 | Geadah et al. | 361/220 |
| 4,041,300 | 8/1977 | Blount | 362/13 |
| 4,271,333 | 6/1981 | Adams et al. | 179/90 K |
| 4,303,960 | 12/1981 | Sherwood et al. | 361/212 |
| 4,322,777 | 3/1982 | Ueta et al. | 361/397 |
| 4,336,529 | 6/1982 | Baun | 340/365 R |
| 4,370,515 | 1/1983 | Donaldson | 174/35 R |

OTHER PUBLICATIONS

Machine Design, J. Kenneth Haggerty, "Membrane Switches–Low Cost Companion for Electronic Logic", Apr. 10, 1980, pp. 90–95, note subsection Effects of Static, pp. 93–94.

Primary Examiner—J. R. Scott
Attorney, Agent, or Firm—Quarles & Brady

[57] ABSTRACT

An improved planar contact array switch having reduced susceptibility to electrostatic discharge includes a printed circuit board which carries at least one switch contact foil pair. Sandwiched between the circuit board and an insulative overlay is a dome-shaped disc which, when depressed, completes an electrical circuit between the switch contact foil pair. Bordering the periphery of the printed circuit board so as to bound the area occupied by each of the switch contact foil pair is a ground foil which advantageously is provided with at least one inwardly extending charge conductive foil which runs adjacent to each of the switch contact foil pairs for conducting any electrostatic discharge which penetrates the overlay within the area bordered by the ground foil. To facilitate the conduction of electrostatic discharges to the perimeter ground foil through the charge conductive foil, a spark gap is provided between each of the switch contact foil pairs and the charge conductive foil so that an electrostatic discharge may jump the spark gap and be conducted via the charge conductive foil on the ground plane to circuit ground.

9 Claims, 5 Drawing Figures

PLANAR CONTACT ARRAY SWITCH HAVING IMPROVED GROUND PATH FOR DISSIPATING ELECTROSTATIC DISCHARGES

BACKGROUND OF THE INVENTION

This invention relates generally to planar contact array switches and more particularly to a planar contact array switch which includes charge conducting paths for conducting electrostatic discharge away from the membrane switch contacts to a ground plane.

A common type of data input device for an electronic circuit is a planar contact array switch. Although the specific construction details of planar contact array switches vary from manufacturer to manufacturer, generally the switch is comprised of a printed circuit board which carries at least one conductive switch contact path, the other switch contact path being adjacent thereto. Overlying the conductive switch contact path on the circuit board is a conductive member, which may be domed in shape. The conductive member is in contact with the other of the switch contact paths and sandwiched between the printed circuit board and an insulative overlay. When the conductive member is urged against the switch contact path on the printed circuit board, such as occurs when a fingertip force is applied to the area of the insulative overlay above the conductive member, then a completed electrical circuit is created between the switch contact paths.

Planar contact array switches are frequently used in industrial environments such as the shop floor of a manufacturing facility since the insulative overlay serves to protect the delicate switch contact paths from industrial contaminants, such as oil, grease or the like, which might otherwise interfere with switch operation. Usually, the insulative overlay is formed from a polycarbonate or polyester plastic so that the insulative overlay may be wiped clean after the inadvertent application of a contaminant as will often occur when the switch is activated by a human operator on the shop floor.

While the insulative overlay associated with this type of planar contact array switch effectively shields the underlying conductive switch contact path from exposure to industrial contaminants, the insulative switch overlay can be penetrated by the high voltage electrostatic discharges which may be transferred from a human operator upon the application of a contact force to the overlay to activate the switch. The electronic circuit components connected to the conductive switch contact paths of the switch are often very sensitive to electrostatic discharges and may be damaged or destroyed if an electrostatic discharge applied to the overlay penetrates the overlay and is conducted to the circuit components through one of the conductive switch contact paths.

In an effort to reduce the likelihood of electronic component damage due to electrostatic discharge, planar contact array switches are often provided with a conductive ground path adjacent to the switch contact area so as to bound the area occupied by the switch contact paths. The ground path serves to conduct any electrostatic discharges away from the conductive switch contact paths and carry them to circuit ground. However, an electrostatic discharge which penetrates the insulative overlay within the area bounded by the ground path may, in fact, "jump" to an adjacent one of the interior conductive switch contact paths before reaching the conductive ground path. Thus, the perimeter ground path may not always be effective to carry electrostatic discharges away from the interior switch contact paths on the printed circuit board.

In an effort to overcome this disadvantage, the present invention is directed to a planar contact array switch in which electrostatic discharges penetrating the insultative overlay within the boundary of the conductive ground path are carried to the conductive ground path rather than allowed to jump to the conductive switch contact paths.

BRIEF SUMMARY OF THE INVENTION

Briefly, in accordance with the preferred embodiment of the invention, there is provided an improved planar contact array switch which includes a printed circuit board having a ground plane path circumscribing one or more conductive switch contact paths and having at least one charge conductive path (typically a printed circuit board conductor) extending from the ground path adjacent to the switch contact paths for carrying electrostatic discharges away from the conductive switch contact paths to the ground path for conduction to circuit ground.

Accordingly, it is an object of the present invention to provide an improved planar contact array switch having reduced susceptibility to electrostatic discharges. The charge conductive paths act to conduct electrostatic discharges to the ground path which electrostatic discharges otherwise might be conducted via one of the conductive switch contact paths to the sensitive electronic circuitry connected to the switch.

It is yet another object of the present invention to provide a planar contact array switch having a "spark gap" between one of the conductive switch contact paths and the charge conductive path and between one of the switch contact paths and the ground path so that an electrostatic charge of sufficient voltage will jump the gap and be conducted to the ground path rather than through one of the switch contact foil pair.

It is yet another object of the present invention to provide a planar contact array switch having not only reduced susceptibility to electrostatic discharge but reduced susceptibility to radio frequency interference. To achieve reduced susceptibility to radio frequency interference, the opposing surface of the planar contact array switch printed circuit board is provided with a radio frequency interference shield which overlies a substantial portion of the reverse board surface. The radio frequency shield is electrically coupled to the ground path to provide a conduction path for interfering radio frequency signals.

Other objects and advantages of the present invention will become readily apparent upon review of the specification and claims.

BRIEF SUMMARY OF THE DRAWINGS

The features of the invention believed to be novel are set forth with particularity in the appended claims. The invention itself, however, both as to organization and method of operation, together with further objects and advantages thereof, may best be understood by reference to the following description, taken in conjunction with the accompanying drawings in which:

DETAILED DESCRIPTION OF THE PREFERRED EMBODIMENT

Figure 1:
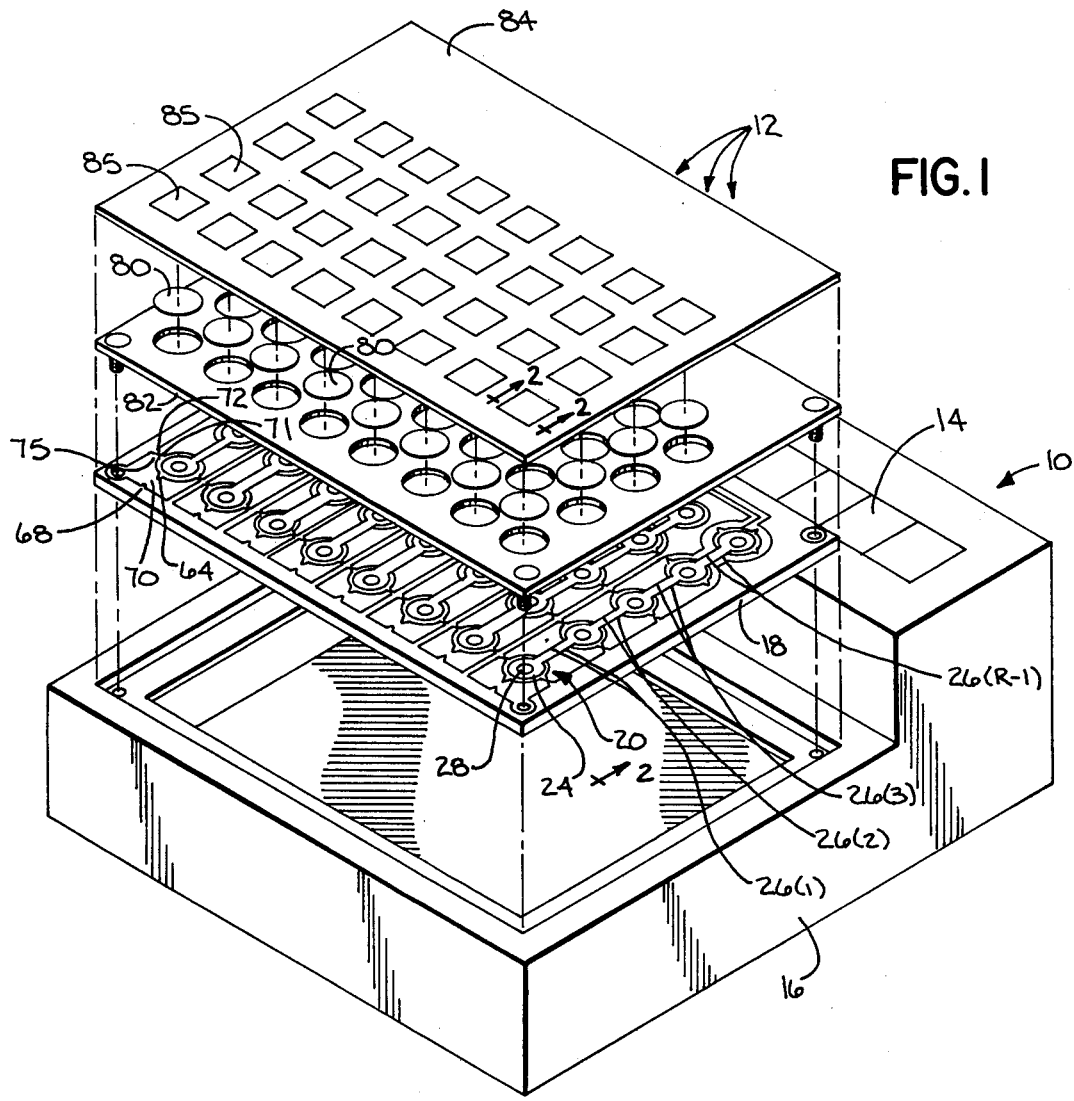
FIG. 1 is an exploded, perspective view of the planar contact array switch of the present invention, as housed within an operator terminal.

FIG. 1 is an exploded view of an operator terminal 10 comprised of a planar contact array switch assembly 12 and a display 14 which are housed together with one or more associated electronic circuits (not shown) within an enclosure 16. The operator terminal 10 serves as an input/output device for an electrical circuit, such as a programmable controller (not shown), to allow an operator to enter commands through the switch assembly 12 to the programmable controller and to receive information from the programmable controller which is then displayed on display 14.

The switch assembly 12 includes a printed circuit board 18 which is typically copper clad on both sides. On the obverse side of the printed circuit board 18 as observed in FIG. 1, the circuit board has at least one and preferably a pair of conductive switch contact paths 20 thereon. In practice, circuit board 18 is etched, by photo resist techniques or the like so that the switch contact paths take the form of foils which remain after etching. Note that the switch contact paths could also be formed on the circuit board by other methods such as striping the board with conductive ink for example. Typically the switch contact foil pairs are arranged in a matrix fashion of C vertical columns, and R horizontal of rows switch contact foil pairs where C and R are integers. In the presently preferred embodiment, the switch contact foil pairs are arranged in an 8×5 array, although other arrangements are possible.

Figure 3:
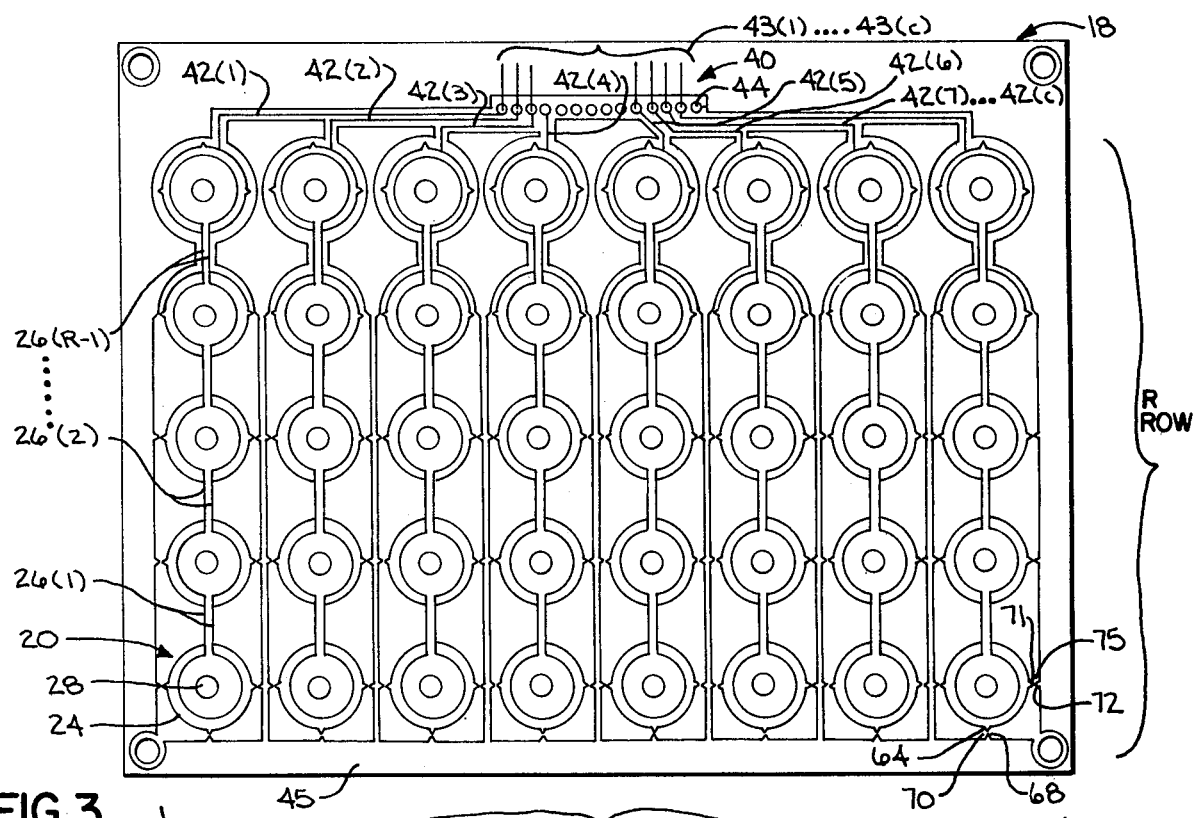
FIG. 3 illustrates the full layout of the obverse or top side of the circuit board of the switch illustrated in FIG. 2.
Figure 5:
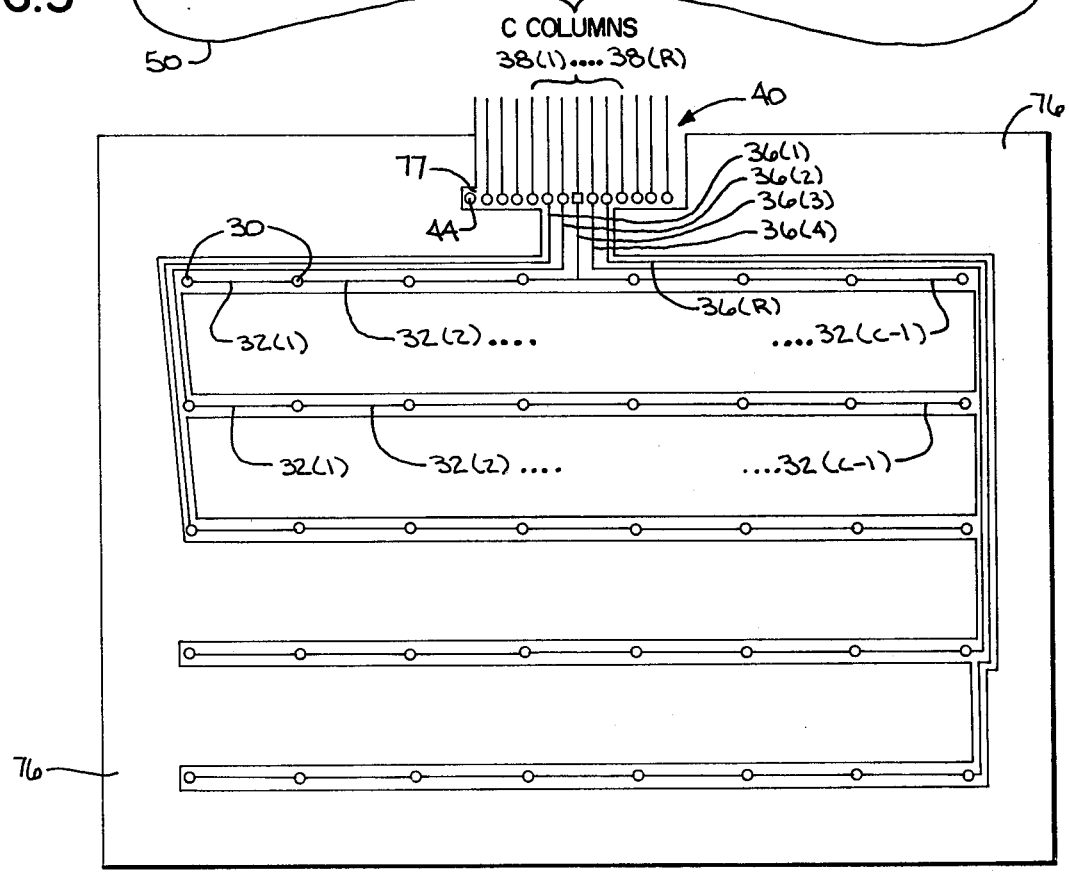
FIG. 5 is an illustration of the layout of the bottom side of the printed circuit board of the switch of the present invention.

Referring now to FIG. 3, which is a plan view of the top or obverse side of the circuit board 18 of FIG. 1, each switch foil pair 20 within each column C of the matrix includes an outer ring foil 24 which is connected by a separate pair of foils 26(1), 26(2) . . . 26(R-1) to the outer switch contact foil 24 of the adjacent switch contact foil pair within the same column which each appears lengthwise in the figure. Concentric within each of the outer ring foils 24 is an inner contact dot foil 28. Each contact dot foil 28 on the top side of the circuit board is in electrical contact with an underlying dot foil 30 on the reverse side of the circuit board, the layout of which is illustrated in FIG. 5.

Referring now to that figure, each dot foil 30 on the reverse circuit board side is connected to the adjacent contact dot foil 30 within the same horizontal row by a corresponding one of connecting foils 32(1), 32(2) . . . 32(C-1). In this way, the outer ring foil 24 of each of the switch contact foil pairs 20 in each matrix column is interconnected with the outer ring foil of the other switch contact foil pairs in the matrix column. In contrast, each inner contact dot foil 28 of switch contact foil pairs 20 within each matrix row is interconnected to the other inner contact dot foils lying in the same matrix row.

Each one of the R rows of the interconnected inner contact dot foils 28 is connected via a separate one of connecting foils 36(1), 36(2), 36(3) . . . 36(R) to a respective one of the pins 38(1) . . . 38(R) of an R+C+1 pin connector 40. As best illustrated in FIG. 3, each one of the C columns of the interconnected outer ring foils 24 is connected via a separate one of connecting foils 42(1), 42(2) . . . 42(C) to one of the pins 43(1), 43(2) . . . 43(C) of the connector 40.

The remaining pin 44 of the connector 40 is coupled to a ground path foil 45 which circumscribes the periphery of the obverse side of the circuit board 18 as illustrated in FIG. 3 so as to bound the area occupied by the switch contact foil pairs 20. The ground path foil 45 around the perimeter of the circuit board 18 acts to prevent any electrostatic discharge from entering the switch contact foil pair matrix from the edges of the switch. Such electrostatic discharges often build up within controlled environments and if such discharges are applied to the switch, as will occur when the switch is contacted by a human member, then there is the likelihood that the discharge will be carried by one of the switch contact foil pairs 20 to the sensitive digital circuitry connected thereto. This may possibly cause damage and destruction to the circuit components. By conducting such electrostatic discharges to ground, the ground path foil 45 serves to reduce the risk of damage to such sensitive digital circuit components. Although the desirability of providing a ground path foil is known in the art, presently available contact array switches have not been provided with a ground path foil at the periphery of the printed circuit board for preventing the electrostatic discharge from entering the circuit board interior.

While the planar contact array switch ground path foil may provide a conductive path for electrostatic discharges, it does so only for those discharges which penetrate the switch 12 adjacent to the periphery of the top side of the printed circuit board 18. An electrostatic discharge which penetrates the switch 12 well within the area bounded by the ground path foil 45 is likely to be conducted to by one of the switch contact foil pairs 20 to the sensitive electronic circuitry connected thereto rather than to circuit ground via the ground path foil 45. Thus, with the conventional ground path foil, damage to the sensitive electrical circuitry connected to the switch contact foil pairs may still occur.

To reduce the susceptibility to electrostatic discharge, the circuit board 18 of the switch 12 is advantageously provided with a plurality of charge conductive paths 50 which, as best illustrated in FIG. 3, take the form of circuit board foils which each extend from the ground plane foil 45 so as to lie between an adjacent pair of columns of the matrix array of contact switch foil pairs 20. As can be appreciated from that figure, each charge conductive path 50 acts to conduct an electrostatic discharge, which may penetrate the switch 12 and contact the circuit board 18 adjacent to one of the interior switch contact foil pairs 20 of the matrix array to the ground path foil 45.

Figure 4:
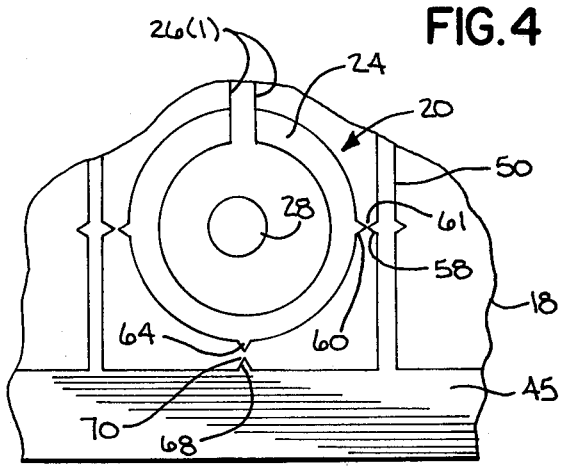
FIG. 4 is an enlarged view of a portion of the circuit board layout illustrated in FIG. 3.

Referring now to FIG. 4, which is an enlarged view of a portion of the circuit board 18 of FIG. 3, each charge conductive foil 50 is provided with a plurality of spikes 58 (which take the form of spike foils only one of which is shown) which each extend towards a separate outer contact ring foil 24 in each column C of switch foil pairs 20. Each conductive ring foil 24 is provided with a conductive spike 60 (which also takes the form of a spike foil) which extends outwardly towards the conductive spike foil 58 so as to be coaxial therewith, but separated a short distance therefrom so as to create a spark gap 61 therebetween. The spark gap 61 enables an electrostatic discharge to jump to the charge conductive foil 50 from the annular outer ring foil 24 and be conducted to the ground path foil 45 for conduction to circuit ground. The extremely small distance between the spike foil 58 of the charge conducting path 50 and the spike foil 60 of the outer conductive ring foils 24 serves to reduce any coupling capacitance between the charge conductive foil 50 and the annular outer contact ring foil 24 of each contact switch foil pair.

As best illustrated in FIGS. 1, 3 and 4, each of the outer ring foil 24 of those switch contact foil pairs 20 within the outermost two rows of the matrix array (the top and bottom rows of FIG. 3) is provided with an outwardly extending conductive spike foil 64 which is coaxial with but separated from a corresponding one of the spike foils 68 extending from the ground path foil 45 so as to create a spark gap 70 between each of spike foils 64 and spike foils 68. In a likewise fashion, each outer ring foil 24 of those switch contact foil pairs 20 lying within each of the two outermost columns of the matrix array of switch contact foil pairs (the right-hand most and left-hand most columns as illustrated in FIGS. 1 and 3) is also provided with an outwardly extending spike foil 71 which is coaxial with, but separated from, the corresponding spike foil 72 extending inwardly from the ground plane foil 45 so as to create a spark gap 75 between each of spike foils 64 and spike foils 68. Each of spark gaps 70 and 75 between the ground plane spike foils and the spike foil of each outer ring foil 24 of the switch contact foil pairs 20 serve a function identical to that of each spark gap 61 between the spike foil 58 of each charge conductive foil 50 and the spike foil 60 on the outer ring foil 24 of the pair of switch contact foils. Thus, depending on where an electrostatic discharge impacts the printed circuit board 18 within the ground plane foil, the electrostatic discharge may jump either of the spark gaps 61, 70 or 75 for conduction to the ground plane foil 45 and ultimately to circuit ground and away from the switch contact foil pairs 20 so as to further reduce the susceptibility of electrostatic discharge to the components connected to the switch contact foil pairs.

To reduce the susceptibility of radio frequency interference, the circuit board 18 is provided on its reverse side with a radio frequency interference (RFI) shield 76 which, as best illustrated in FIG. 5, takes the form of a substantially solid foil etched on the reverse side of the circuit board. The shield is connected to pin 44 by connecting foil 77. The RFI shield 76 is not completely solid since areas must be provided on the reverse circuit board side for foils 30 and connecting foils 32(1), 32(2) . . . 32(C-1) and 36(1), 36(2) . . . 36(R).

Figure 2:
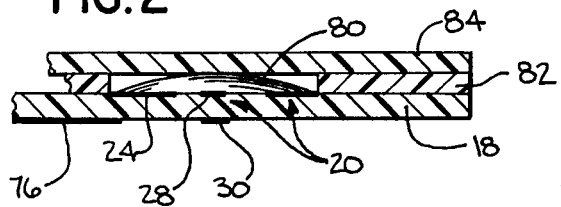
FIG. 2 is a sectional view of the switch of FIG. 1 taken along lines 2—2 thereof.

The remainder of the switch 12 is conventional in its construction and to this end, there is provided a plurality of conductive members 80 which, as best illustrated in FIG. 1 are each seated in a corresponding passageway of an overlaying spacer plate 82 so that each conductive member 80 overlies the outer conductive ring foil 24 of a corresponding one of the switch contact foil pairs 20 lying within the first R-1 rows of the matrix array. The Rth row of the switch contact foil pairs (which appears at the top of the circuit board) is typically left unused so as to be reserved for expansion, to be utilized later upon the addition of overlying conductive members. Referring to FIG. 2, each conductive member 80 takes the form of a domed metal disc which, in its quiescent state only makes electrical contact with the outer ring foil 24 of the switch contact foil pair.

Overlying the spacer plate 82, and the conductive members 80 is an insulative membrane 84, typically taking the form of a sheet of polycarbonate or polyester plastic or the like. As illustrated in FIG. 1, the membrane 84 is configured such that each of the areas 85 of the membrane overlying each conductive member 80 carries a particular indicia (not shown) which identifies the input data entered by completing an electrical circuit between the inner dot foil 28 and the outer ring foil 24 of the pair of switch contact foils 20, as occurs upon finger pressure against the membrane area 85. Although the membrane 85 serves to shield and insulate the conductive member 80 and the underlying switch contact foil pair, should an electrostatic discharge penetrate the area 85 of the membrane 84 overlying the conductive member 80, the electrostatic discharge will readily jump one of spark gaps 61, 70 or 75 and be carried to circuit ground to the ground foil 45 rather than be conducted through a conductive foil such as conductive foil 26 of FIG. 4. In this way, the switch 12, which embodies the printed circuit board 18 configured in the manner described, achieves reduced susceptibility to electrostatic discharge in comparison to switches of the prior art.

What has been described thus far is a switch which includes a printed circuit board which is provided with at least one charge conductive member extending inwardly from a perimeter ground plane for providing a conductive path for electrostatic discharges which penetrate the switch membrane.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. An improved switch comprising:
   a substrate having a first surface which embodies a perimeter ground path thereon and at least one switch contact path laterally spaced from said ground path;
   a conductive member overlying said switch contact path but only making electrical contact therewith to complete an electrical circuit therewith when said conductive member is urged against said switch contact path; and
   at least one charge conductive path on said first surface of said substrate so as to extend from said ground path adjacent to said switch contact path for carrying any electrostatic discharge impacting said substrate adjacent to said switch contact path away from said switch contact path to said ground path.

2. The invention according to claim 1 further including an insulative overlay secured to said surface of said substrate to overlie said conductive member so that said conductive member is sandwiched between said overlay and said first surface of said substrate.

3. The invention according to claim 1 further including a conductive spike path extending from said switch contact path towards said charge conductive path and a conductive spike path extending from said charge conductive path towards said conductive spike extending from said switch contact path so as to form a spark gap therebetween to enable an electrostatic discharge to jump said spark gap and to be carried along said charge conductive path to said ground path.

4. The invention according to claim 1 wherein said substrate carries a radio frequency interference shield on its surface opposing said first surface.

5. The invention according to claim 1 wherein said substrate carries a plurality of switch contact paths arranged in a matrix array of C columns by R rows and wherein said substrate carries a plurality of charge conductive paths, each charge conductive path extending from said ground plane between an adjacent pair of columns of said switch contact paths.

6. The invention according to claim 3 wherein each of said plurality of charge conductive paths includes a plurality of charge conductive spikes, each extending from each said conductive path towards a separate one of the switch contact foil pairs of each of said columns of switch contact foil pairs and wherein each of said switch contact paths of each said column has a charge conductive spike extending outwardly therefrom towards the corresponding charge conductive spike on an adjacent one of said of charge conductive paths so as to form a spark gap therebetween to enable an electrostatic discharge to jump said spark gap and to be carried along each said charge conductive path to said ground plane.

7. The invention according to claim 5 wherein each of said switch paths within said matrix array which is located closest to said ground path is provided with a spike path extending outwardly toward said ground plane path and wherein said ground path is provided with a plurality of spike paths, each extending inwardly toward the corresponding spike path associated with each of said switch contact paths located closest to said ground path.

8. A printed circuit board having a metal clad surface which embodies a perimeter ground path foil thereon and at least one switch contact foil pair lying within the area bounded by said perimeter ground path foil wherein the improvement comprises;
    at least one charge conductive foil embodied on said metal clad substrate surface so as to extend from said ground path foil adjacent to said switch contact foil pair for carrying any electrostatic discharge impacting the printed circuit board adjacent to the switch contact foil pair away from the switch contact foil pair to the ground path foil.

9. The invention according to claim 7 further including:
    a first conductive spike foil extending from one of the switch contact foil pairs towards said charge conductive foil and a second conductive spike foil extending from said charge conductive foil towards said first conductive spike foil so as to form a spark gap therebetween to enable an electrostatic discharge to jump across said spark gap from said switch contact foil pair so as to be carried along said charge conductive path to the ground plane.

* * * * *